United States Patent
Khakifirooz et al.

(10) Patent No.: US 9,793,341 B1
(45) Date of Patent: Oct. 17, 2017

(54) DEEP TRENCH CAPACITOR WITH METAL PLATE

(71) Applicant: GLOBALFOUNDRIES INC., Grand Cayman (KY)

(72) Inventors: Ali Khakifirooz, Los Altos, CA (US); Davood Shahrjerdi, White Plains, NY (US); Herbert L. Ho, New Windsor, NY (US); Kangguo Cheng, Schenectady, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/170,224

(22) Filed: Jun. 1, 2016

(51) Int. Cl.
  *H01L 27/108* (2006.01)
  *H01L 21/8242* (2006.01)
  *H01L 49/02* (2006.01)

(52) U.S. Cl.
  CPC .................................... *H01L 28/92* (2013.01)

(58) Field of Classification Search
  CPC ............... H01L 29/945; H01L 27/1087; H01L 27/10861; H01L 28/40; H01L 27/1085; H01L 28/92
  USPC .......................................... 257/301; 438/243
  See application file for complete search history.

(56) References Cited

U.S. PATENT DOCUMENTS

| | | | | |
|---|---|---|---|---|
| 8,361,875 B2 * | 1/2013 | Zhu | .................... | H01L 27/10805 257/301 |
| 8,883,605 B2 * | 11/2014 | Chen | ....................... | H01L 28/90 438/386 |
| 9,490,257 B2 * | 11/2016 | Arnold | .............. | H01L 27/10829 |

* cited by examiner

*Primary Examiner* — Luan C Thai
(74) *Attorney, Agent, or Firm* — Anthony Canale; Andrew M. Calderon; Roberts Mlotkowski Safran Cole & Calderon

(57) ABSTRACT

The present disclosure generally relates to semiconductor structures and, more particularly, to a deep trench capacitor, integrated structures and methods of manufacture. The structure includes: a conductive material formed on an underside of an insulator layer and which acts as a back plate of a deep trench capacitor; an inner conductive layer extending through the insulator layer and an overlying substrate; and a dielectric liner between the inner conductive material and the conductive material, and formed on a sidewall of an opening within the insulator layer and the overlying substrate.

19 Claims, 6 Drawing Sheets

US 9,793,341 B1

DEEP TRENCH CAPACITOR WITH METAL PLATE

FIELD OF THE INVENTION

The present disclosure generally relates to semiconductor structures and, more particularly, to a deep trench capacitor, integrated structures and methods of manufacture.

BACKGROUND

Capacitors, such as trench capacitors, and more specifically deep trench capacitors, can assist in power supply decoupling. Additionally, with a deep trench capacitor, it is possible to implement more capacitance in a smaller area. However, as chip technology continues to advance, logic switching and data transfer rates increase. As logic switching and data transfer rates increase, the need for power supply decoupling increases as well.

SUMMARY

In an aspect of the disclosure a structure comprises: a conductive material formed on an underside of an insulator layer and which acts as a back plate of a deep trench capacitor; an inner conductive layer extending through the insulator layer and an overlying substrate; and a dielectric liner between the inner conductive material and the conductive material, and formed on a sidewall of an opening within the insulator layer and the overlying substrate.

In an aspect of the disclosure a structure comprises: a deep trench capacitor comprising: a metal back plate layer which is formed on an underside of an insulator layer and which has a thickness of at least the deep trench capacitor; conductive material formed within an opening of the insulator layer and within the metal back plate layer; and a dielectric liner between the conductive material and the metal back plate layer.

In an aspect of the disclosure a method comprises: forming a trench in a substrate; lining the trench with a dielectric liner; filling the trench with a conductive material over the dielectric liner; removing the substrate to expose the dielectric liner; and depositing an outer conductive material on the dielectric liner to form a back plate.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure generally relates to semiconductor structures and, more particularly, to a deep trench capacitor, integrated structures and methods of manufacture. In embodiments, the deep trench capacitor includes a metal back plate comprised of an entire metal layer formed on a back side of the structure, which provides lower resistance than conventional capacitor structures. That is, in embodiments, the deep trench capacitor described herein provides capacitance for a given area while exhibiting low resistance.

In embodiments, the trenches can be formed in a substrate of differing widths and heights. The trenches can be filled with material to form deep trench capacitor structures and moat structures. These materials can include a trench dielectric, an inner conductive material such as a metal layer, and a conductive material such as a doped polysilicon. The thickness of the inner conductive material can be greater than a thickness of the dielectric. In embodiments, a conductive metal can be deposited over the trench dielectric to form a back plate of low resistance due to its thickness, e.g., amount of material. Depending on the design criteria of the deep trench capacitors, the trench dielectric can be a low-k dielectric material, a high-k dielectric material or a combination of both. In addition, the conductive metal can be planarized to expose the trench dielectric material of the moat structure, or be provided at different thicknesses over the moat structure. The deep trench capacitor provides a given capacitance for a given area, while the conductive metal allows for a lower resistance by acting as a back plate for the deep trench capacitor.

The structures of the present disclosure can be manufactured in a number of ways using a number of different tools. In general, though, the methodologies and tools are used to form structures with dimensions in the micrometer and nanometer scale. The methodologies, i.e., technologies, employed to manufacture the structure of the present disclosure have been adopted from integrated circuit (IC) technology. For example, the structures are built on wafers and are realized in films of material patterned by photolithographic processes on the top of a wafer. In particular, the fabrication of the structure uses three basic building blocks: (i) deposition of thin films of material on a substrate, (ii) applying a patterned mask on top of the films by photolithographic imaging, and (iii) etching the films selectively to the mask.

Figure 1:
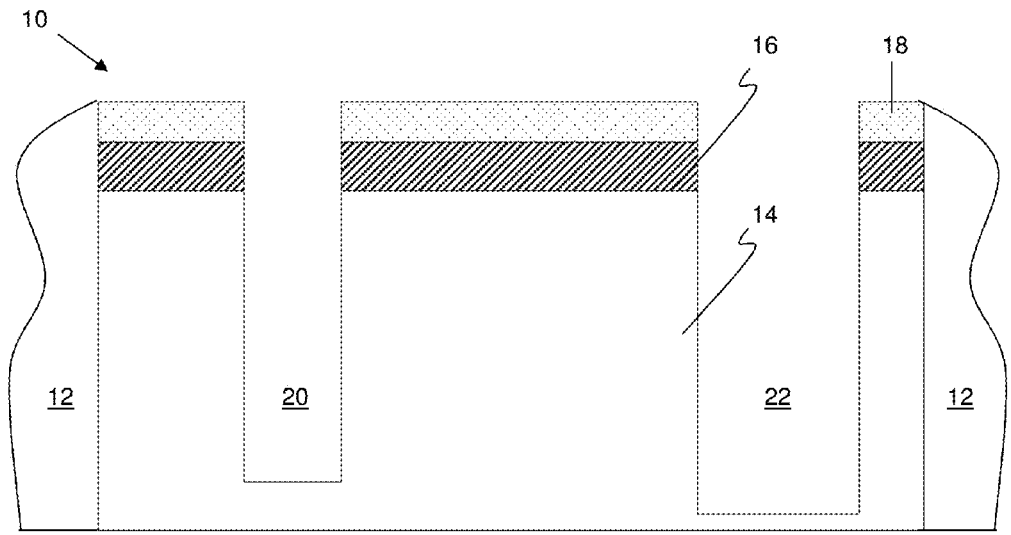
FIG. 1 shows a cross-sectional view of a trenches and respective structures and respective fabrication processes in accordance with aspects of the present disclosure.

FIG. 1 shows a cross-sectional view of a structure and respective fabrication processes in accordance with aspects of the present disclosure. More specifically, the structure 10 includes a substrate 12 which can be any suitable wafer, e.g., silicon, although other materials are contemplated herein. For example, the substrate 12 can be a silicon on insulator (SOI) substrate. In this implementation, an insulator layer 16 is formed on a bulk substrate 14. In embodiments, the insulator layer can be, e.g., a buried oxide (BOX) layer 16 formed on the bulk substrate 14. The BOX layer 16 can be formed by any conventional processes such as a deposition or bonding process. A silicon-on-insulator (SOI) substrate 18 is formed over the BOX layer 16. The SOI layer 18 can be formed in any conventional manner such as SiMOX or other bonding techniques. The SOI layer 18 can be any suitable semiconductor material, such as silicon (Si), silicon-germanium (SiGe), or other standard semiconductor materials.

Still referring to FIG. 1, trenches 20 and 22 are formed through the SOI layer 18, the BOX layer 16, and within the bulk substrate 14. The trenches 20 and 22 can be used to form a deep trench capacitor and a moat structure as further described herein. In embodiments, the trenches 20, 22 can be formed by conventional CMOS processes. For example, a photoresist can be formed on the SOI layer 18 and exposed to energy to form a pattern (openings). In some embodiments, a hardmask layer in conjunction with the photoresist can be used to form the openings. An etching process is then performed through the openings to form the trenches 20, 22. In embodiments, the etching process can be, e.g., a reactive ion etching (RIE) using chemistries selective to the materials of the SOI 18, BOX layer 16 and substrate 14. After formation of the trenches 20, 22, the resist can be removed using conventional stripants or other techniques such as oxygen ashing process. Hardmask, if present, can be removed in any process after the formation of trenches 20, 22.

As further shown in FIG. 1, the trenches 20, 22 can have differing depths and widths in relation to one another. For example, the trench 20 (e.g., which will be used to form of the deep trench capacitor) can be narrower and shallower than the trench 22 (e.g., which will be used to form of the moat structure). More specifically, the trench 20 can have a width in a range of about 50-150 nm, while the depth can be in a range of about 0.2-10 microns, although other dimensions are contemplated herein. In comparison, the width of the trench 22 can be about 1.5-2 times (×) the width of the trench 20. Additionally, the depth of the trench 22 can be about 1 micron deeper than the depth of the trench 20. Therefore, the depth of the trench 22 can be in a range of about 2-10 microns, although other dimensions are contemplated herein.

As should be understood by those of skill in the art, the larger width of the trench 22 allows for a greater obtainable depth. It should further be understood that the width of the trench 20 may correspond to the width of a deep trench capacitor, whereas, the width of trench 22 may correspond to the moat structure. Therefore, the moat structure will have a greater depth and a greater width than the deep trench capacitor 21. More specifically, just like the trenches, the width of the moat structure can be about 1.5-2 times (×) the width of the deep trench capacitor.

Figure 2:
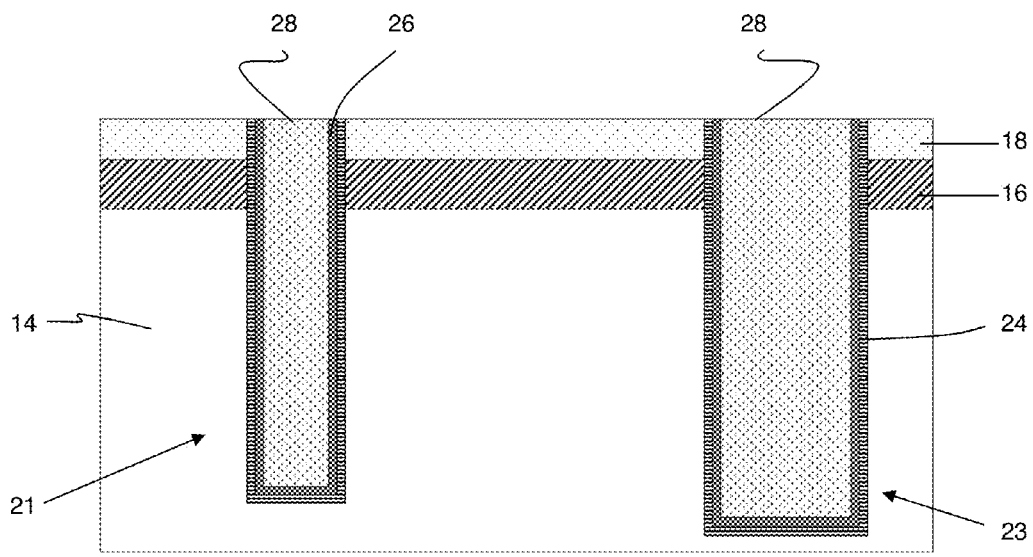
FIG. 2 shows a cross-sectional view of a capacitor and moat structures and respective fabrication processes in accordance with aspects of the present disclosure.

In FIG. 2, a deep trench capacitor 21 and the moat structure 23 are formed in the respective trenches 20, 22 using conventional deposition processes. For example, the trenches are filled with a dielectric liner 24, an inner conductive material 26 such as a metal layer, and a conductive material 28. For example, the dielectric liner 24 can be any suitable material such as a low-dielectric constant material. More specifically, in embodiments, the dielectric liner 24 can be a low-k (k refers to the relative dielectric constant) dielectric material such as silicon nitride or silicon oxide, amongst other suitable materials. The dielectric liner 24 can have a thickness in a range of about 2-8 nm, although other dimensions are contemplated herein.

Still referring to FIG. 2, the inner conductive material 26 can be a metal or a metal alloy. More specifically, the inner conductive material 26 can be titanium nitride (TiN), amongst other suitable conductive materials, e.g., metals and metal alloys. In embodiments, the inner conductive material 26 can have a thickness in a range of about 5-20 nm, although other dimensions are contemplated herein. In addition, the conductive material 28 can be any suitable material such as doped polysilicon. Alternatively, the conductive material 28 can be other conductive materials such as tungsten or other suitable metal, for example. In some embodiments, the conductive material 28 can have multiple conductive materials.

Still referring to FIG. 2, the dielectric liner 24, inner conductive material 26, and conductive material 28 can be deposited using conventional deposition processes. Specifically, the dielectric liner 24, inner conductive material 26, and conductive material 28 can be deposited using separate deposition steps such as, e.g., chemical vapor deposition (CVD) processes. After the deposition of the dielectric liner 24, inner conductive material 26 and conductive material 28, any residual material on a surface of the SOI 18 can be removed using a conventional process, e.g., chemical mechanical polish (CMP).

Figure 3:
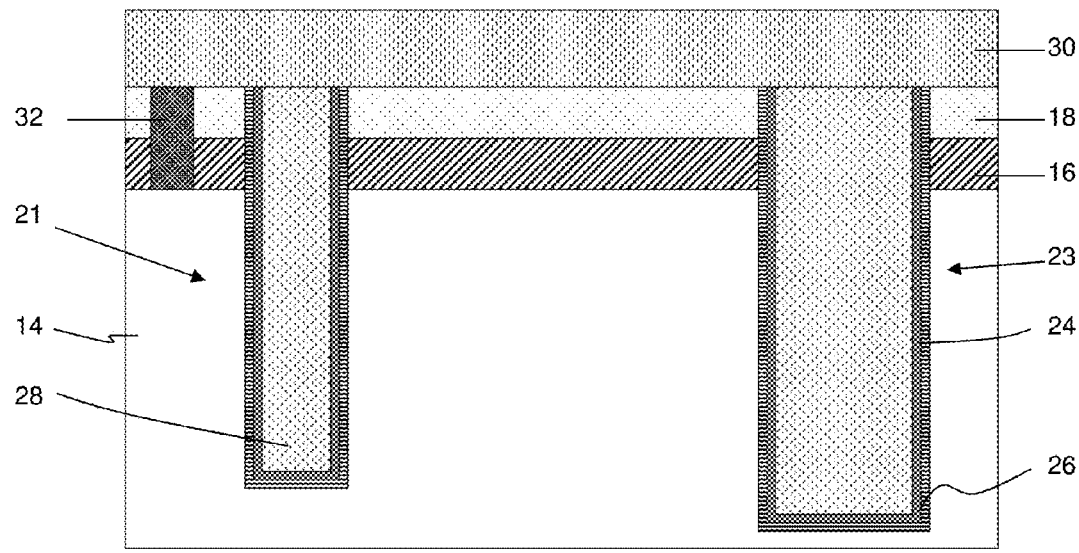
FIG. 3 shows a cross-sectional view of a contact and FEOL/BEOL layer and respective fabrication processes in accordance with aspects of the present disclosure.

FIG. 3 shows a cross-sectional view of front-end-of-line (FEOL)/back-end-of-line (BEOL) device layers 30 and a contact 32 formed over the deep trench capacitor 21 and the moat structure 23. The contact 32 can be any suitable conductive material such tungsten, amongst other examples. In embodiments, the contact 32 is formed by conventional CMOS processes, e.g., lithography, etching and deposition processes. It should be noted that the formation of the contact 32 can occur at any suitable stage in the fabrication process.

Still referring to FIG. 3, the front-end-of-line (FEOL)/back-end-of-line (BEOL) device layers 30 can be formed in one or more dielectric layers. The front-end-of-line (FEOL)/back-end-of-line (BEOL) devices 30 can be any active/passive structures such as transistors, resistors, isolations, and/or wires formed using standard CMOS processes.

Figure 4:
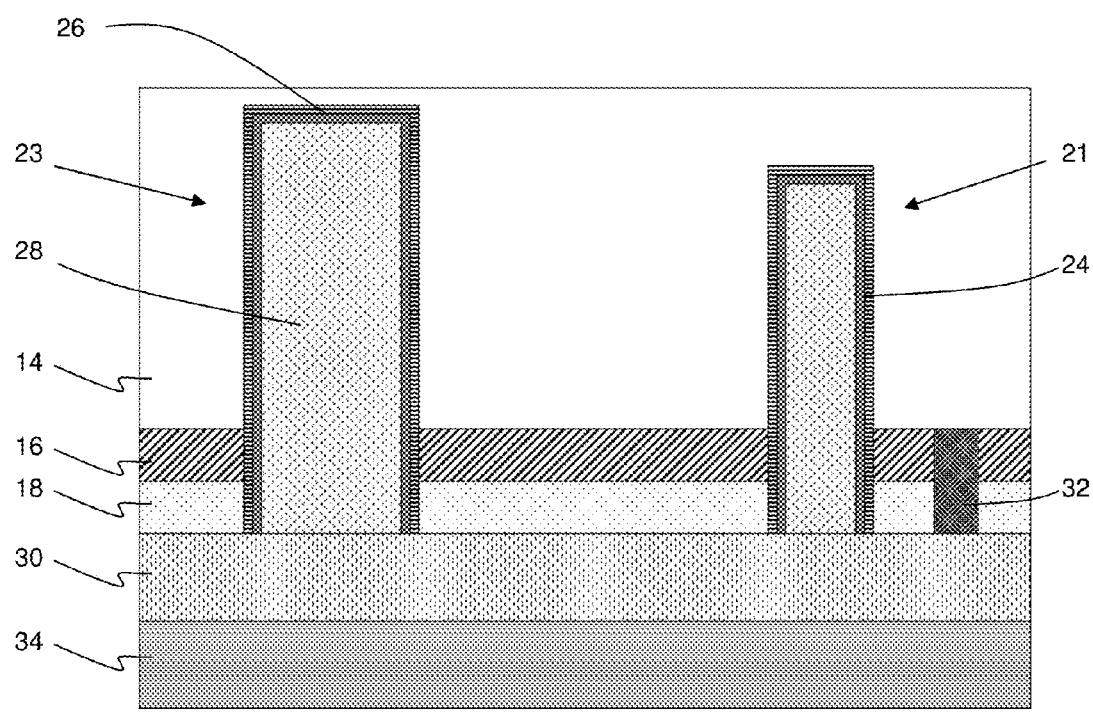
FIG. 4 shows a cross-sectional view of a handle wafer bonded to the structure of FIG. 3, and respective fabrication processes in accordance with aspects of the present disclosure.

In FIG. 4, the structure of FIG. 3 is bonded to a handle wafer 34. More specifically, the uppermost front-end-of-line (FEOL)/back-end-of-line (BEOL) device layer 30 is bonded to the handle wafer 34 by any suitable bonding process, e.g., oxide-oxide bonding. By bonding to the handle wafer 34, the structure can be rotated in order to provide additional processing to the substrate 14.

Figure 5:
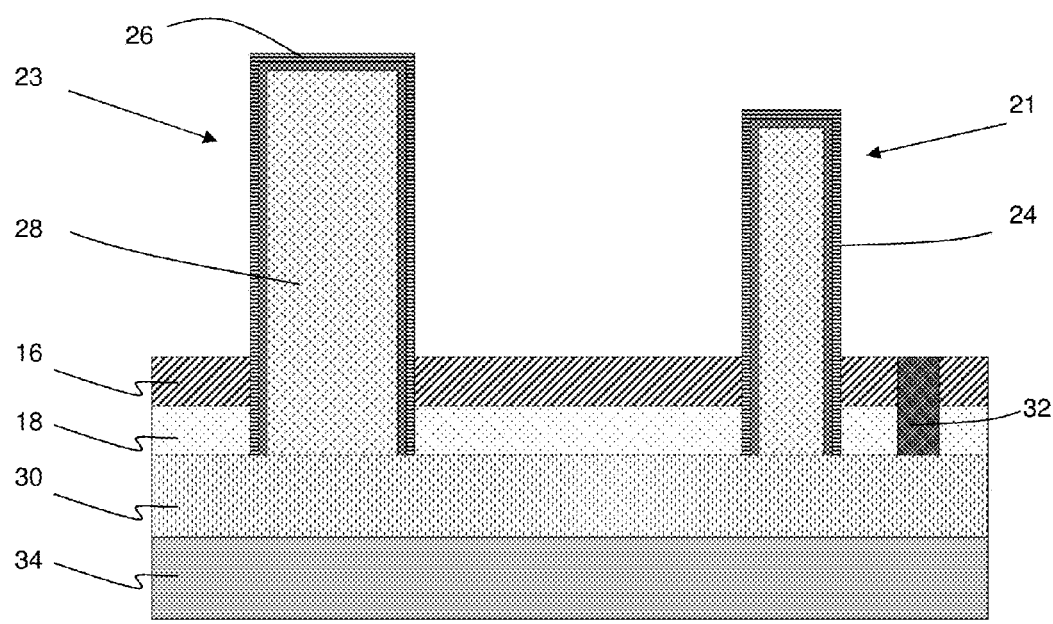
FIG. 5 shows a cross-sectional view of removal of a substrate and respective fabrication processes in accordance with aspects of the present disclosure.

As shown in FIG. 5, the substrate (substrate 14) is removed to expose the dielectric liner 24 of the deep trench capacitor 21 and the moat structure 23. In embodiments, the substrate can be removed by conventional etching processes or, alternatively, a grinding process followed by an etching process. In embodiments, the etching process can be a dry etch or wet etch. As shown in FIG. 5, the etching process is selective to the removal of the substrate 14, hence leaving the insulator layer 16 and the dielectric liner 24 intact.

Figure 6:
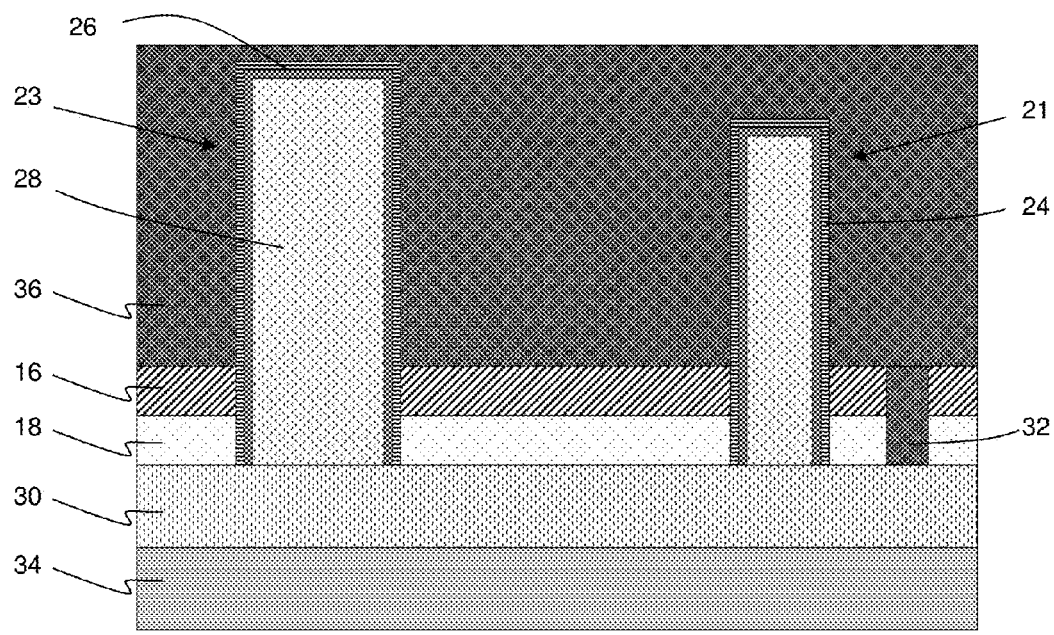
FIG. 6 shows a cross-sectional view of a conductive material formed over the capacitor and moat structure, and respective fabrication processes in accordance with aspects of the present disclosure.

FIG. 6 shows a cross-sectional view of a deposition of a conductive material 36 in accordance with aspects of the present disclosure. More specifically, the conductive material 36 can be deposited on the insulator layer 16 and the dielectric liner 24 (of both the deep trench capacitor 21 and the deep moat structure 23) using a conventional deposition process, e.g., CVD, followed by a CMP process. In embodiments, the conductive material 36 can be any suitable conductive material such as tungsten, aluminum, copper, TiN, or a combination of conductive materials. In embodiments, the conductive material 36 will be deposited using a blanket deposition process on the back side of the structure, covering the entirety of the area previously occupied by the substrate, hence acting as a large metal back plate for the deep trench capacitor 21. As the conductive material 36 covers a large portion of the structure and is not merely a liner material, it is possible to obtain a much lower resistance for the capacitor structure.

Figure 7A:
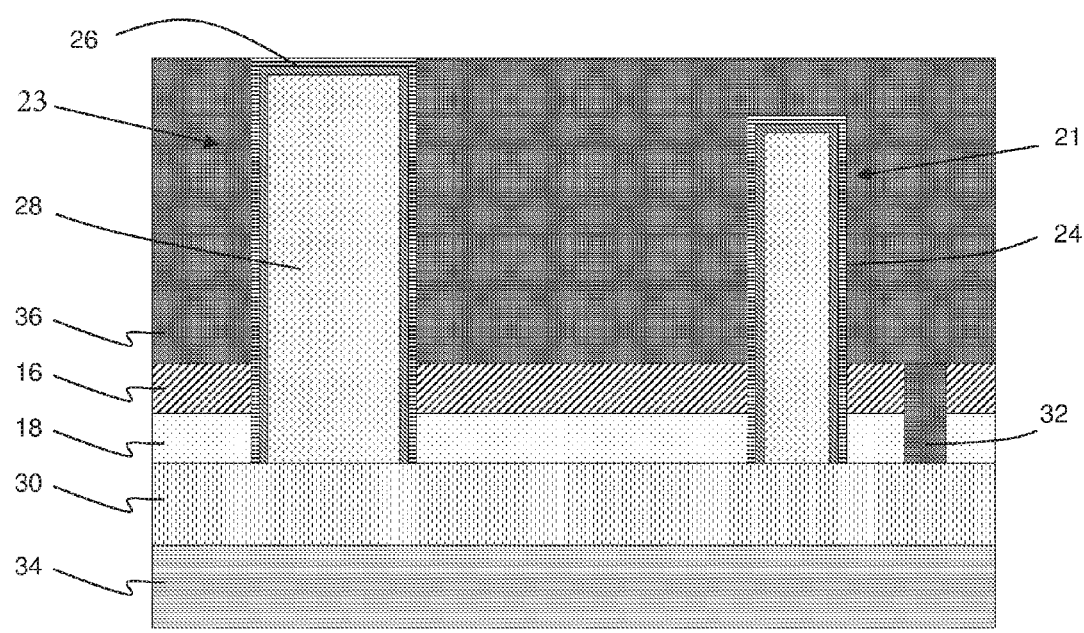
FIG. 7A shows a cross-sectional view of a planarized surface of the conductive material and respective fabrication processes in accordance with aspects of the present disclosure.

Continuing to FIG. 7A, in embodiments, the conductive material 36 can be polished down by CMP processes to expose the dielectric liner 24 on the bottom portion of the moat structure 23. As should be understood by those of skill in the art, by stopping on the moat structure 23, the moat structure 23 and the deep trench capacitor 21 can have different metal back plate islands. In this configuration, both terminals of a cap of the deep trench capacitor 21 can be accessed. Also, the conductive metal 36, which acts as a conductive back plate material for the deep trench capacitor 21, has a thickness larger than a depth of the deep trench capacitor 21. The conductive material 36 also has a thickness about equal to a depth of the moat structure 23.

Figure 7B:
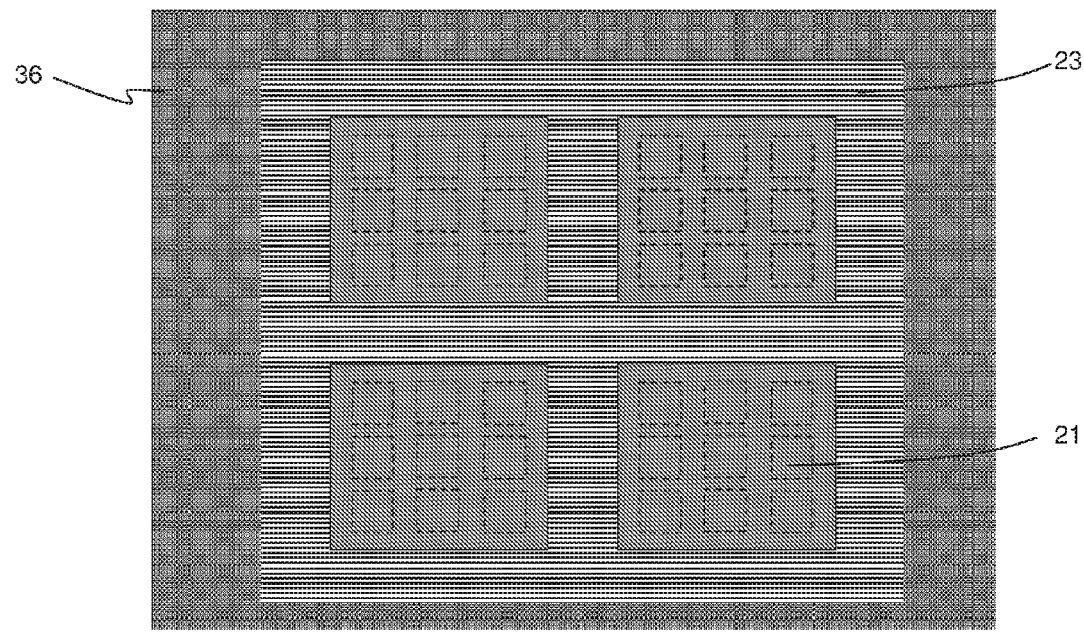
FIG. 7B shows a plan view of the structure of FIG. 7A in accordance with aspects of the present disclosure.

FIG. 7B shows a plan view of the structure of FIG. 7A. More specifically, FIG. 7B shows the moat structure 23 acting as isolation structures for multiple deep trench capacitors 21 forming an array of deep trench capacitors. As previously noted, the depth and width of the deep trench capacitors 21 are less than that of the moat structures 23.

Figure 8:
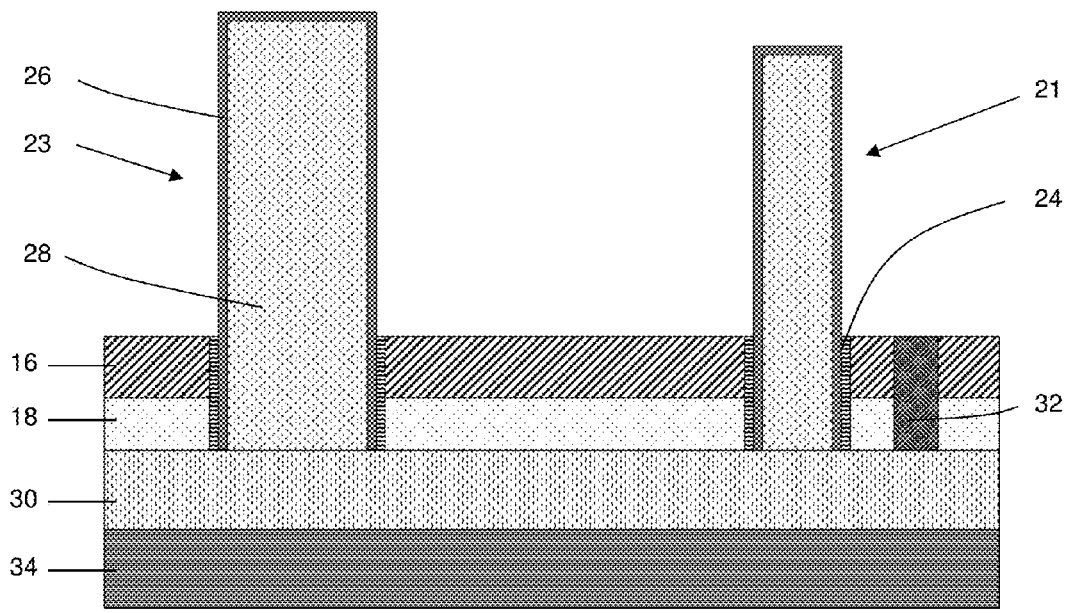
FIGS. 8-10 illustrate an alternative embodiment and respective fabrication processes in accordance with aspects of the present disclosure.
Figure 9:
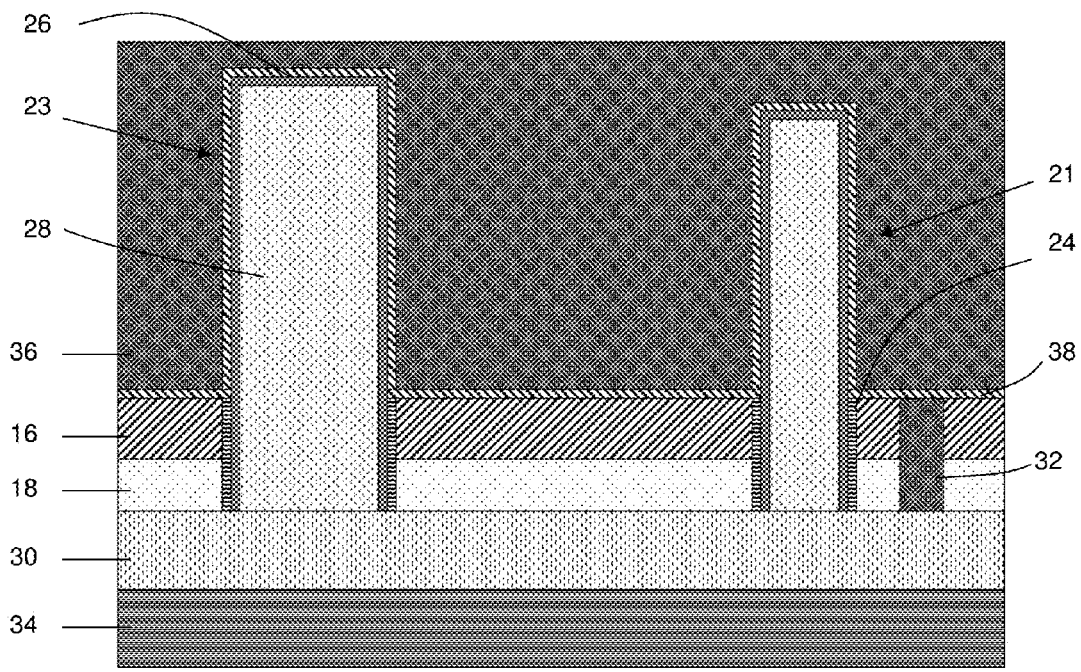
Figure 10:
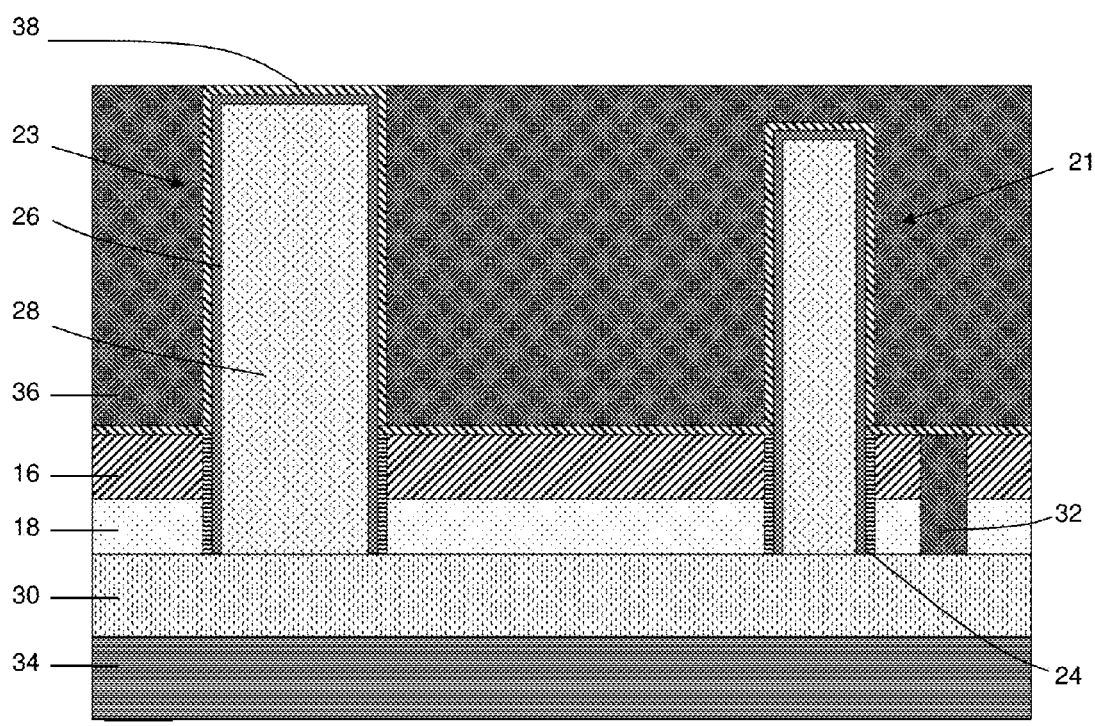

FIGS. 8-10 illustrate an alternative embodiment and respective fabrication processes in accordance with aspects of the present disclosure. For example, in the embodiments shown in FIGS. 8-10, the dielectric liner can be composed of a different material, using a different processing scheme. More specifically, as shown in FIG. 8, after the fabrication processes shown in FIG. 5, the exposed portion of the dielectric liner 24 can be removed by an etching process. For example, the exposed portions of the dielectric liner 24 can be removed by a dry or wet etching process, selective to the material of the dielectric liner 24, e.g., silicon nitride. This etching process will expose the underlying inner conductive material 26.

As shown in FIG. 9, a dielectric layer 38 is formed over the inner conductive material 26 and the exposed insulator layer 16, e.g., BOX layer, using a conventional deposition process, e.g., CVD. In embodiments, this dielectric layer 38 can be a high-k dielectric material such as zirconium dioxide ($ZrO_2$) or hafnium oxide) ($HfO_2$), among other suitable high-k materials. In embodiments, the dielectric layer 38 has a thickness substantially the same as the dielectric material 24. In other embodiments, the dielectric layer 38 has a thickness less than the dielectric material 24. For example, the dielectric material 24 may have a thickness of about 4 nm to about 10 nm. The dielectric layer 38 may have a thickness of about 2 nm to about 8 nm.

In contrast to the structure of FIG. 7A, the structure of FIG. 9 has two distinguishable dielectric layers, e.g., a low-k dielectric material and a high-k dielectric material. Moreover, by forming the dielectric layer 38, e.g., high-k dielectric material, later in the fabrication processes, it can be assured that the high-k dielectric material will not be adversely affected by the thermal budget required by subsequent processes, e.g., deposition and etching of certain materials.

Still continuing with FIG. 9, a conductive metal 36 is deposited on the dielectric layer 38. The conductive material, similar to that described in FIG. 6, can be deposited by a CVD process, and can be any appropriate conductive material 36, e.g., tungsten, aluminum, copper, TiN, or a combination of conductive materials. In FIG. 10, the conductive metal 36 can be polished to expose the dielectric layer 38 of the moat structure 23.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:
1. A structure comprising:
 a conductive material formed on an underside of an insulator layer and which acts as a back plate of a deep trench capacitor;
 an inner conductive layer extending through the insulator layer and an overlying substrate; and
 a dielectric liner between the inner conductive layer and the conductive material, and formed on a sidewall of an opening within the insulator layer and the overlying substrate, wherein the dielectric liner comprises a low-k dielectric within the opening of the insulator layer and a high-k dielectric sandwiched between the conductive material and the inner conductive material.

2. The structure of claim 1, further comprising at least one FEOL/BEOL layer formed above the insulator layer.

3. The structure of claim 2, wherein the deep trench capacitor extends to a bottom surface of the at least one of the FEOL/BEOL layer.

4. The structure of claim 1, wherein the conductive material has a thickness larger than a depth of the deep trench capacitor.

5. The structure of claim 1, further comprising a moat structure comprising the conductive material, the inner conductive layer and the dielectric liner.

6. The structure of claim 5, wherein a depth of the moat structure is greater than a depth of the deep trench capacitor within the conductive material.

7. The structure of claim 5, wherein the conductive material has a thickness about equal to a depth of the moat structure.

8. The structure of claim 5, wherein a width of the moat structure is about 1.5 to 2 times larger than a width of the deep trench capacitor.

9. The structure of claim 1, wherein the inner conductive material has a thickness greater than the dielectric liner.

10. The structure of claim 1, wherein the dielectric liner is low-k dielectric material.

11. A structure comprising:
a deep trench capacitor comprising:
a metal back plate layer which is formed on an underside of an insulator layer and which has a thickness of at least the deep trench capacitor;
conductive material formed within an opening of the insulator layer and within the metal back plate layer; and
a dielectric liner between the conductive material and the metal back plate layer.

12. The structure of claim 11, further comprising a moat structure comprising the metal back plate layer, the conductive material and the dielectric liner.

13. The structure of claim 12, wherein the metal back plate layer has a thickness greater than or equal to a depth of the moat structure.

14. The structure of claim 13, wherein a width of the moat structure is about 1.5 to 2 times larger than the width of the deep trench capacitor and a depth of the moat structure is greater than a depth of the deep trench capacitor.

15. The structure of claim 11, wherein the dielectric liner is a combination of a low-k dielectric material and a high-k dielectric material.

16. The structure of claim 11, wherein the deep trench capacitor extends to a surface of a FEOL/BEOL layer.

17. A method, comprising:
forming a trench in a substrate;
lining the trench with a dielectric liner;
filling the trench with a conductive material over the dielectric liner;
removing the substrate to expose the dielectric liner;
removing a portion of the exposed dielectric liner;
depositing a dielectric material in place of the removed portion of the exposed dielectric liner; and
depositing an outer conductive material directly on the dielectric material to form a back plate and sandwiching the dielectric material between the conductive material and the outer conductive material, wherein the dielectric liner is a low-k dielectric material and the dielectric material is a high-k dielectric material.

18. The method of claim 17, wherein the removing the portion of the dielectric liner exposes the conductive material, prior to the depositing the outer conductive material, and the dielectric material is deposited on the conductive material.

19. The structure of claim 11, wherein the dielectric liner comprises a low-k dielectric within the opening of the insulator layer and a high-k dielectric sandwiched between the conductive material and the metal back plate layer.

* * * * *